US011412641B2

(12) United States Patent
Simonazzi

(10) Patent No.: US 11,412,641 B2
(45) Date of Patent: Aug. 9, 2022

(54) ELECTRONIC POWER APPARATUS FOR ELECTRIC OR HYBRID CARS AND RELATED REALIZATION PROCESS

(71) Applicant: META SYSTEM S.P.A., Reggio Emilia (IT)

(72) Inventor: Giuseppe Simonazzi, Reggio Emilia (IT)

(73) Assignee: Meta System S.p.a., Reggio Emilia (IT)

(*) Notice: Subject to any disclaimer, the term of this patent is extended or adjusted under 35 U.S.C. 154(b) by 161 days.

(21) Appl. No.: 16/624,850

(22) PCT Filed: Jun. 22, 2018

(86) PCT No.: PCT/IB2018/054626
§ 371 (c)(1),
(2) Date: Dec. 19, 2019

(87) PCT Pub. No.: WO2018/235049
PCT Pub. Date: Dec. 27, 2018

(65) Prior Publication Data
US 2021/0298208 A1    Sep. 23, 2021

(30) Foreign Application Priority Data
Jun. 23, 2017  (IT) .................. 102017000070324

(51) Int. Cl.
*H05K 7/20* (2006.01)
*H05K 7/14* (2006.01)
(52) U.S. Cl.
CPC ....... *H05K 7/20927* (2013.01); *H05K 7/1432* (2013.01); *H05K 7/20945* (2013.01)

(58) Field of Classification Search
CPC .................................................... H02M 7/003
See application file for complete search history.

(56) References Cited

U.S. PATENT DOCUMENTS

| 5,483,423 A * | 1/1996 | Lewis ..................... G06F 1/182 |
| | | 174/358 |
| 6,313,991 B1 | 11/2001 | Nagashima et al. |
| 6,404,628 B1 | 6/2002 | Nagashima et al. |
| 9,694,689 B2 * | 7/2017 | Yamasaki ................. B60L 9/16 |
| 2003/0151893 A1 * | 8/2003 | Meyer ................... H02M 7/003 |
| | | 361/688 |
| 2016/0205808 A1 * | 7/2016 | Yuque .................. F16M 13/022 |
| | | 165/80.4 |
| 2019/0394901 A1 * | 12/2019 | Esders ............... H05K 7/20218 |

FOREIGN PATENT DOCUMENTS

EP              2922375 A1       9/2015

* cited by examiner

*Primary Examiner* — Mukundbhai G Patel
(74) *Attorney, Agent, or Firm* — David B. Tingey; Bryant J. Keller; Kirton McConkie

(57) ABSTRACT

The electronic power apparatus for electric or hybrid cars comprises an external container, an electronic power circuit housed inside the container and configured for the conversion of an input current/voltage into a predefined output current/voltage, a liquid cooling circuit made at a portion of the container for cooling the electronic power circuit, wherein the container comprises a housing body of the electronic power circuit in a polymeric material and comprises at least one portion provided with the liquid cooling circuit.

7 Claims, 10 Drawing Sheets

| Sensor | Plastic container Temp. [°C] @300V HVDC | Aluminum container Temp. [°C] @300V HVDC |
| --- | --- | --- |
| Water temperature | 20 | 20 |
| LLC1 temp. (IMS) | 23 | 26 |
| PFC1 temp. (IMS) | 26 | 27 |
| Trasf1 temp. (WINDING) | 70 | 74 |
| RES1 temp. (WINDING) | 48 | 55 |
| LLC2 temp. (IMS) | 25 | 25 |
| PFC2 temp. (IMS) | 25 | 28 |
| TASF2 temp. (WINDING) | 68 | 71 |
| RES2 temp. (WINDING) | 40 | 50 |

Fig.14

ELECTRONIC POWER APPARATUS FOR ELECTRIC OR HYBRID CARS AND RELATED REALIZATION PROCESS

TECHNICAL FIELD

The present invention relates to an electronic power apparatus for electric or hybrid cars, in particular of the type of a liquid-cooled electronic power apparatus for the voltage/current conversion, as well as a related realization process.

BACKGROUND ART

With reference to the electric or hybrid vehicle sector, the use of electronic power apparatus installed on board vehicles is indispensable for the conversion of an input voltage/current into an output voltage/current, such as OBC (On-Board Charger) battery chargers or DC-DC converters.

Such apparatuses commonly comprise power electronics which require a dedicated cooling system which is able to keep the temperature at acceptable levels during use.

In fact, it is well known that all the electronic apparatuses used for energy conversion (from alternating voltage/current to direct voltage/current or from direct voltage/current to direct voltage/current), not having unit efficiency, inevitably dissipates energy in the form of heat, energy that is directly proportional to the powers used.

To overcome this drawback, also known is that the heat generated by energy conversion can be dissipated by air cooling (forced or unforced) or by a liquid cooling system.

Therefore, the electronics of energy conversion apparatuses of known type is commonly enclosed inside a metal container, preferably made entirely of aluminum.

More specifically, the aluminum container is used to enable effective heat dissipation through air dissipation, during energy conversion.

Air cooling is also obtained by means of the presence of appropriate fins made at predefined portions on the outer surface of the container itself.

Furthermore, the apparatuses of known type commonly comprise a fluid cooling circuit which is made at a portion of the container and used for cooling part of internal electronics.

However, the apparatuses of known type do have a number of drawbacks.

In fact, the realization of the aluminum container involves considerably high manufacturing costs.

In particular, the aluminum container is commonly made using a die-casting process and this involves the use of special dies which commonly have a limited life span (about 50,000 to 80,000 pieces), with the consequent need to replace these dies with planned interventions.

Therefore, the need to use new dies considerably increases the overall realization costs of the apparatus.

Furthermore, after die-casting, the container must necessarily be further machined, with consequent increase in overall realization time and costs.

Furthermore, the liquid cooling circuit used is made at a limited portion of the container and, therefore, only allows effective cooling of a part of the internal electronics.

DESCRIPTION OF THE INVENTION

The main aim of the present invention is to provide an electronic power apparatus for electric or hybrid cars and a related realization process which is able to allow more efficient cooling of the entire internal electronics.

Another object of the present invention is to provide an electronic power apparatus for electric or hybrid cars which allows curbing the emissions of electromagnetic waves generated during energy conversion.

Another object of the present invention is to provide an electronic power apparatus for electric or hybrid cars which is lighter than conventional solutions.

Another object of the present invention is to provide an electronic power apparatus for electric or hybrid cars which allows achieving a significant reduction in overall realization costs.

Another object of the present invention is to provide an electronic power apparatus for electric or hybrid cars which is easier to produce than known solutions.

Another object of the present invention is to provide an electronic power apparatus for electric or hybrid cars which has more effective electrical insulation than conventional solutions.

The aforementioned objects are achieved by the present electronic power apparatus for electric or hybrid cars according to the combination of characteristics described in claim 1.

The aforementioned objects are also achieved by the present realization process of an electronic power apparatus for electric or hybrid cars according to the combination of characteristics described in claim 8.

BRIEF DESCRIPTION OF THE DRAWINGS

Other characteristics and advantages of the present invention will become more evident from the description of a preferred, but not exclusive embodiment of an electronic power apparatus for electric or hybrid cars and a related realization process, illustrated by way of an indicative, but non-limiting example, in the attached drawings in which.

Figure 15:
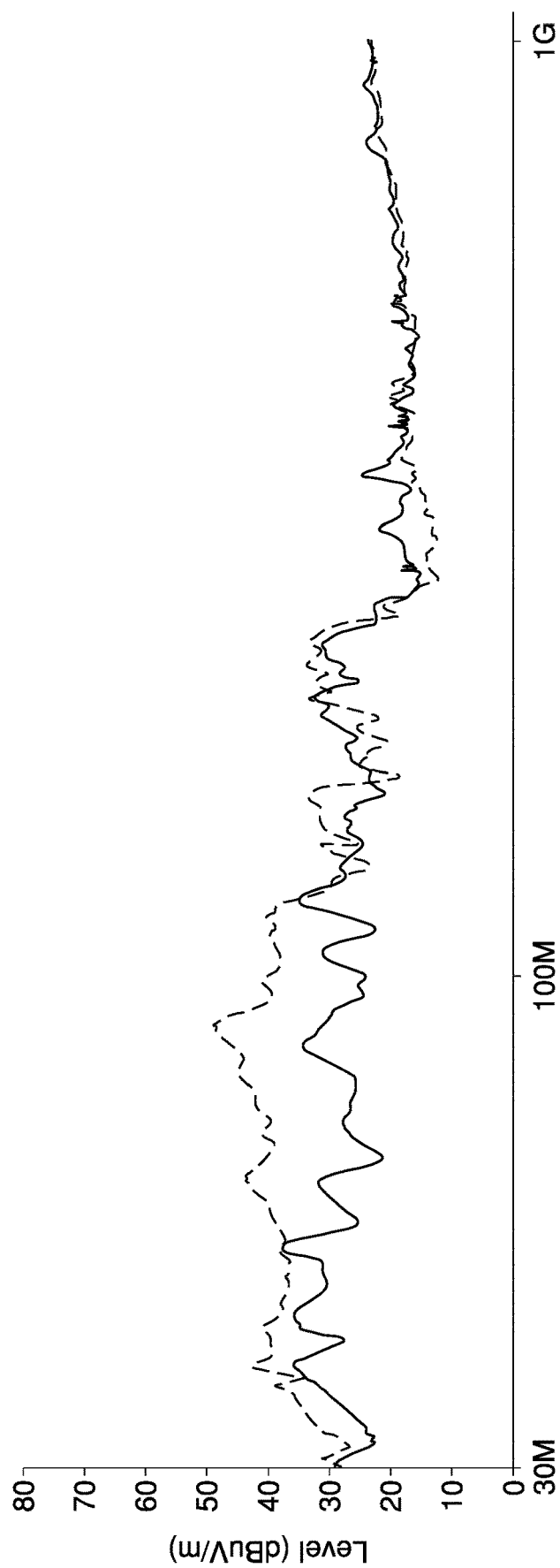

FIGS. from 3 to 13 schematically illustrate the realization process of an electronic power apparatus according to the invention;

FIG. 14 illustrates an exemplary table showing the temperatures measured by various sensors positioned on the electronic power circuit of the apparatus according to the invention, compared with the temperatures measured on a known type of apparatus;

FIG. 15 illustrates an exemplary graph showing the variation of the emission level of electromagnetic waves of the apparatus according to the invention, compared with the variation of the emission level of electromagnetic waves of an apparatus of known type.

EMBODIMENTS OF THE INVENTION

With particular reference to these illustrations, reference numeral 1 globally indicates an electronic power apparatus for electric or hybrid cars.

In particular, the apparatus according to the invention is of the type of a liquid-cooled electronic power apparatus, usable for the conversion of an input voltage/current into an output voltage/current.

For example, the apparatus according to the invention can be made up of an apparatus for recharging batteries of electric or hybrid vehicles or of an apparatus for DC-DC conversion.

With reference to the specific embodiment illustrated in the figures, the apparatus 1 is composed of an OBC battery charger (On-Board Charger).

Different embodiments cannot however be ruled out, in which the apparatus according to the invention is made up of a different electronic power apparatus.

Figure 1:
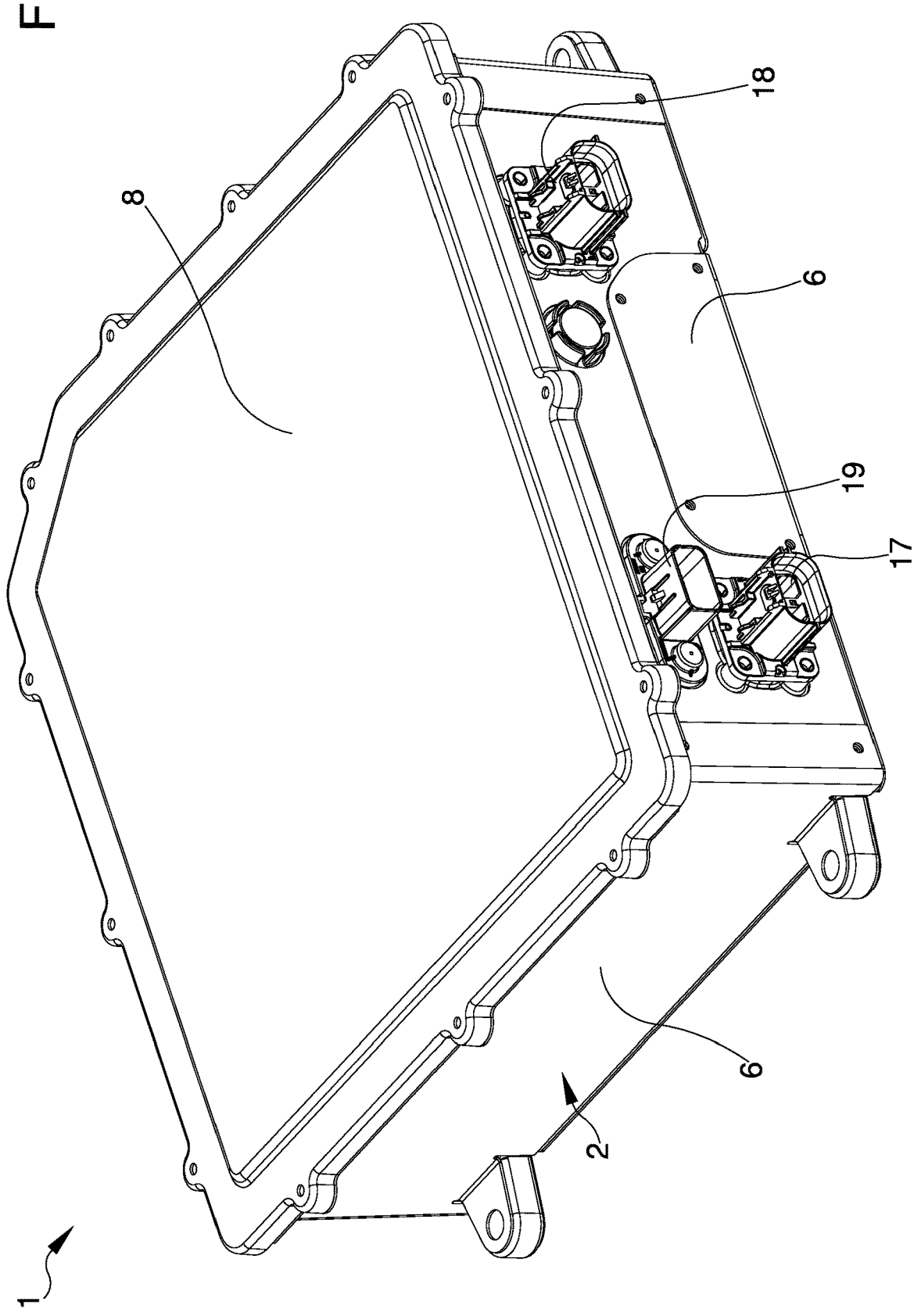
FIG. 1 is an axonometric view of the electronic power apparatus according to the invention.

The apparatus 1 comprises at least one external container, globally indicated in FIG. 1 with reference numeral 2.

Figure 2:
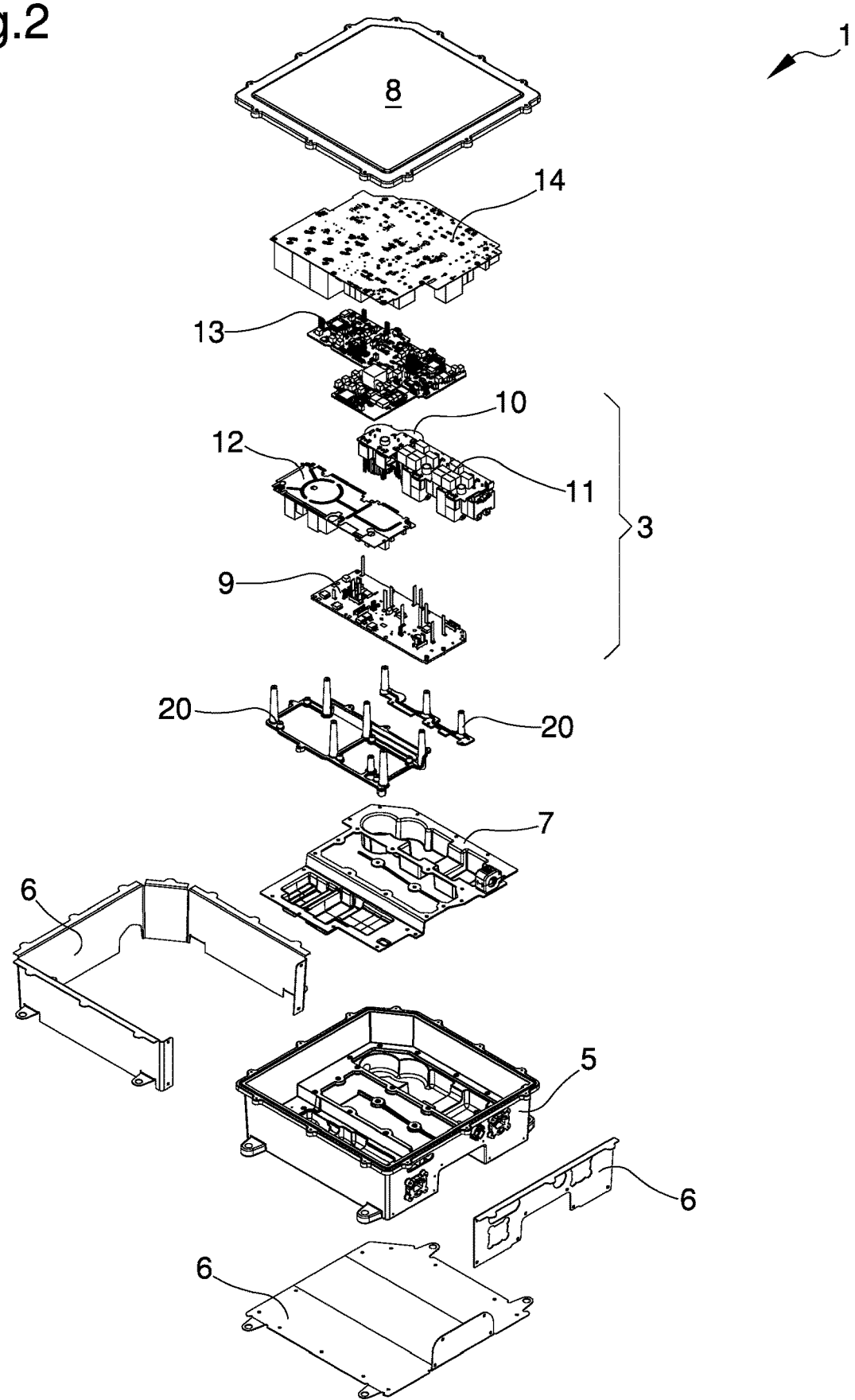
FIG. 2 is an exploded view of the electronic power apparatus according to the invention.

The apparatus 1 also comprises at least one electronic power circuit, globally indicated in FIG. 2 with reference numeral 3, housed inside the container 2 and configured for the conversion of an input current/voltage into a predefined output current/voltage.

At least one liquid cooling circuit 4 is made at a portion of the container 2 for cooling the electronic power circuit 3.

Advantageously, the container comprises a housing body 5 adapted to house the electronic power circuit 3, made of a polymeric material and comprising at least one internal portion provided with the liquid cooling circuit 4.

In particular, the realization of the housing body 5 allows for a significant reduction in overall realization costs compared to solutions of known type, in which the entire container is made of aluminum.

In fact, the realization of the housing body 5 in polymeric material permits avoiding the complex and costly die-casting processes commonly used to make metal containers.

Furthermore, the use of the housing body 5 made of polymeric material provides additional benefits, as shown below.

The container 2 also comprises at least one shielding metal sheet 6 associated with at least one portion of the outer surface of the housing body 5 made of polymeric material, used for the shield of the electromagnetic waves generated by the electronic power circuit 3.

This way, despite the use of a housing body 5 in polymeric material, effective shielding is nevertheless ensured of the electromagnetic waves generated during the use of the apparatus 1.

Preferably, the shielding metal sheet 6 extends over the entire outer surface of the housing body 5.

In particular, with reference to the specific embodiment of the apparatus 1 illustrated in the figures, the container 2 comprises three different shielding metal sheets 6, suitably folded and shaped and fixed to respective portions of the outer surface of the housing body 5.

In order to ensure effective heat dissipation, the container 2 comprises at least one heat dissipation metal jig 7, provided with at least one housing seat for the electronic power circuit 3 and associated with at least one inner portion of the housing body 5, at at least one length of the liquid cooling circuit 4.

The metal jig 7, therefore, is adapted to house the electronic power circuit 3 and, by means of the liquid cooling circuit 4, allows the effective cooling of the components of the electronic power circuit 3 during use of the apparatus 1.

In particular, with reference to the specific embodiment of the apparatus 1 illustrated in the figures, the container 2 comprises at least a heat dissipation metal jig 7, provided with a plurality of housing seats for the electronic power circuit 3 and associated with one inner portion of the housing body 5, at the bottom of the housing body itself.

In particular, the liquid cooling circuit 4 is partly made up of the suitably shaped bottom of the housing body 5 itself. In fact, appropriate depressions and protrusions made on the bottom of the housing body 5 define the path which the cooling fluid must follow starting from an inlet mouth 4a as far as an outlet mouth 4b.

Therefore, with reference to this preferred embodiment, the cooling circuit 4 is composed of a sequence of interspaces defined between the inner surface of the housing body 5 and the metal jig 7.

The metal jig 7 is provided with housing seats which are adapted to house respective components of the electronic power circuit 3 and is provided with a lower surface in contact with the coolant. This permits the effective cooling of the components of the electronic power circuit 3 during use of the apparatus 1. The container 2 also comprises a metal closure cover 8 of the housing body 5. Preferably, the metal cover 8 is made of aluminum.

As shown above, the specific apparatus 1 according to the embodiment shown in the figures consists of an OBC battery charger (On-Board Charger).

In such case, the electronic power circuit 3 of the apparatus 1 comprises at least the following components, which are conventionally present in an OBC battery charger:
- at least one IMS (Insulated Metal Substrate) printed circuit 9;
- at least one PFC (Power Factor Correction) circuit 10;
- at least one LLC circuit 11;
- at least one AC filter 12.

As an alternative to the IMS printed circuit 9, the electronic power circuit 3 may comprise another type of printed circuit combined with a suitable heat sink. Furthermore, the internal electronics of the apparatus 1 comprise:
- at least one command printed circuit 13;
- at least one supply printed circuit 14.

The electronic components listed above are housed in the container 2 and are suitably connected to each other in the same way as provided for solutions of known type.

More specifically, with reference to the apparatus 1 according to the invention, the IMS printed circuit 9 is fixed to the metal jig 7 with the relative metal substrate in contact with the cooling fluid of the cooling circuit 4.

This way, therefore, an effective cooling of the IMS printed circuit and of the components of the electronic power circuit 3 connected to it is ensured.

The embodiment of the apparatus 1 according to the invention is described below.

Figure 3:
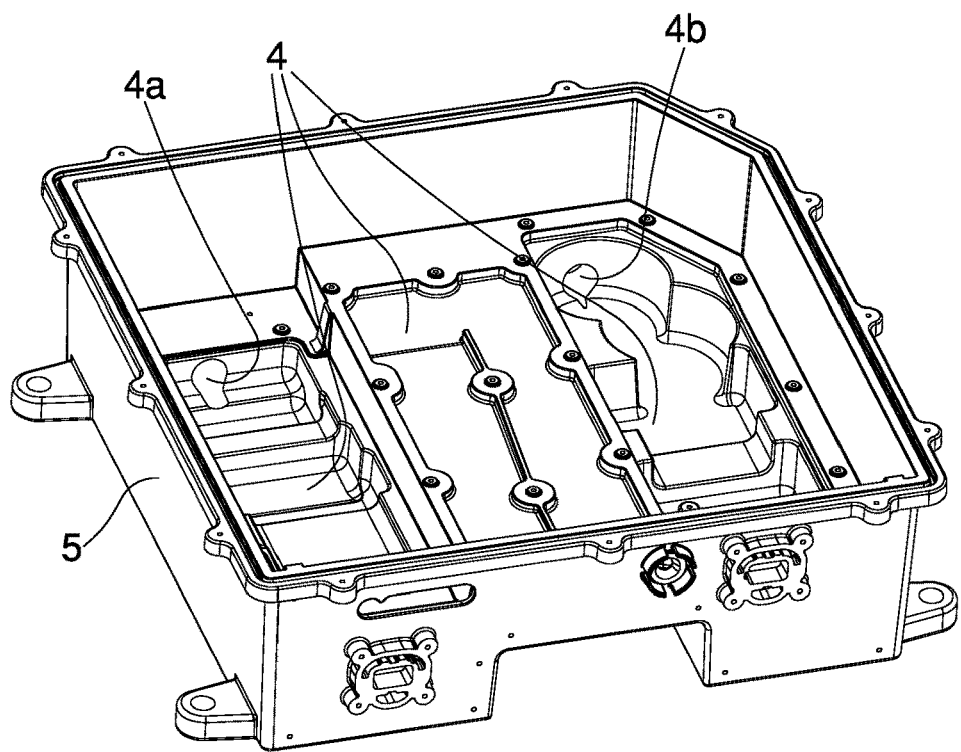

The process comprises, first of all, the realization of the housing body 5 made of polymeric material (FIG. 3).

For example, the housing body 5 can be made by an injection molding of polymeric material.

The process then provides for the realization of the liquid cooling circuit 4 at at least one inner portion of the housing body 5.

In particular, with reference to the specific and preferred embodiment shown in the illustrations, the liquid cooling circuit 4 is partly made up of the suitably shaped bottom of the housing body 5 itself. In fact, appropriate depressions and projections made (during molding) on the bottom of the housing body 5 define the path which the cooling fluid must follow starting from an inlet mouth 4a as far as an outlet mouth 4b.

Figure 4:
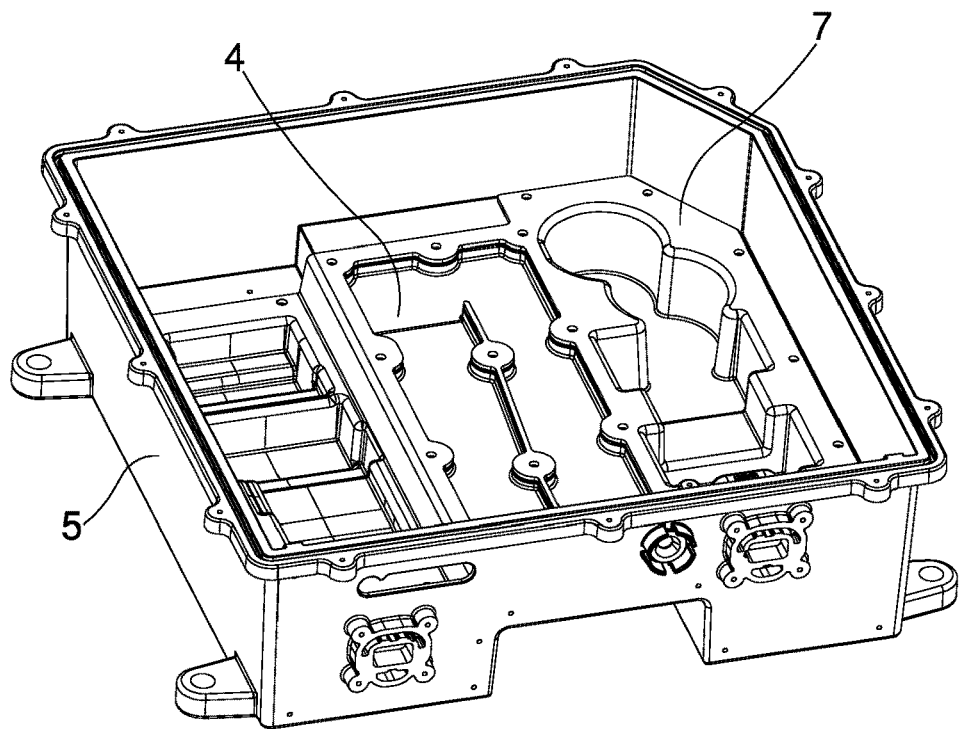
Figure 5:
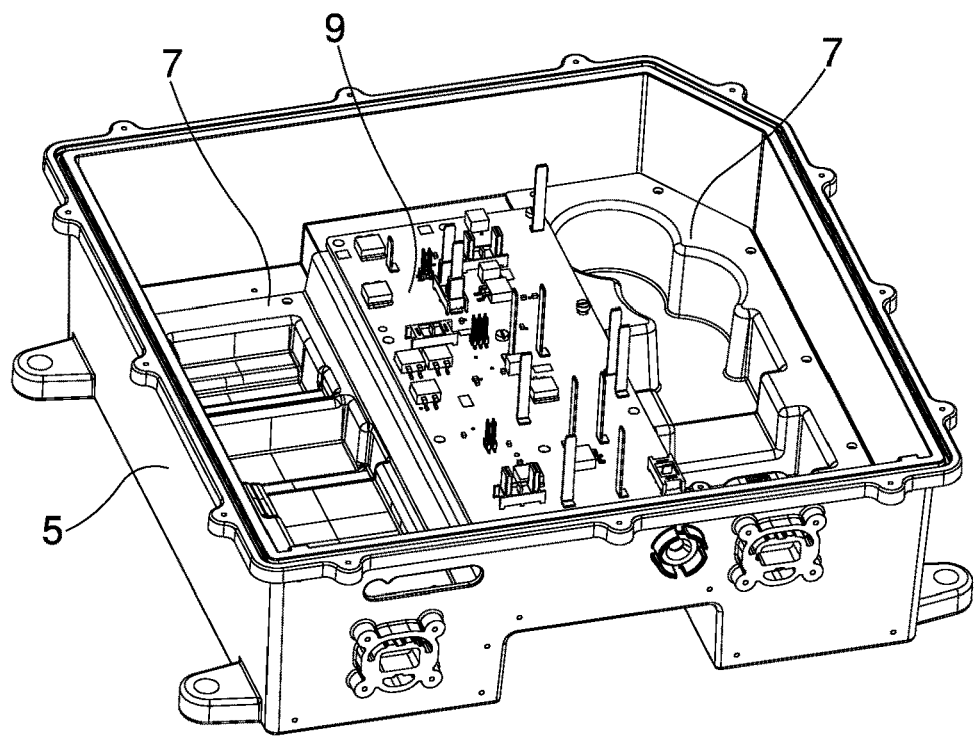
Figure 6:
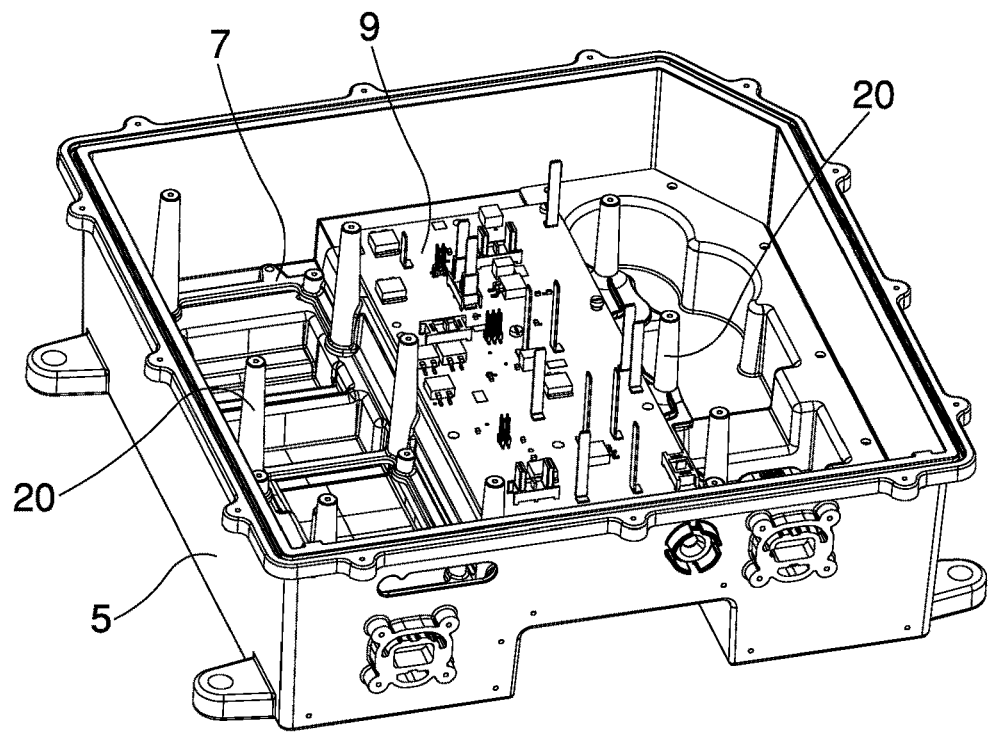
Figure 7:
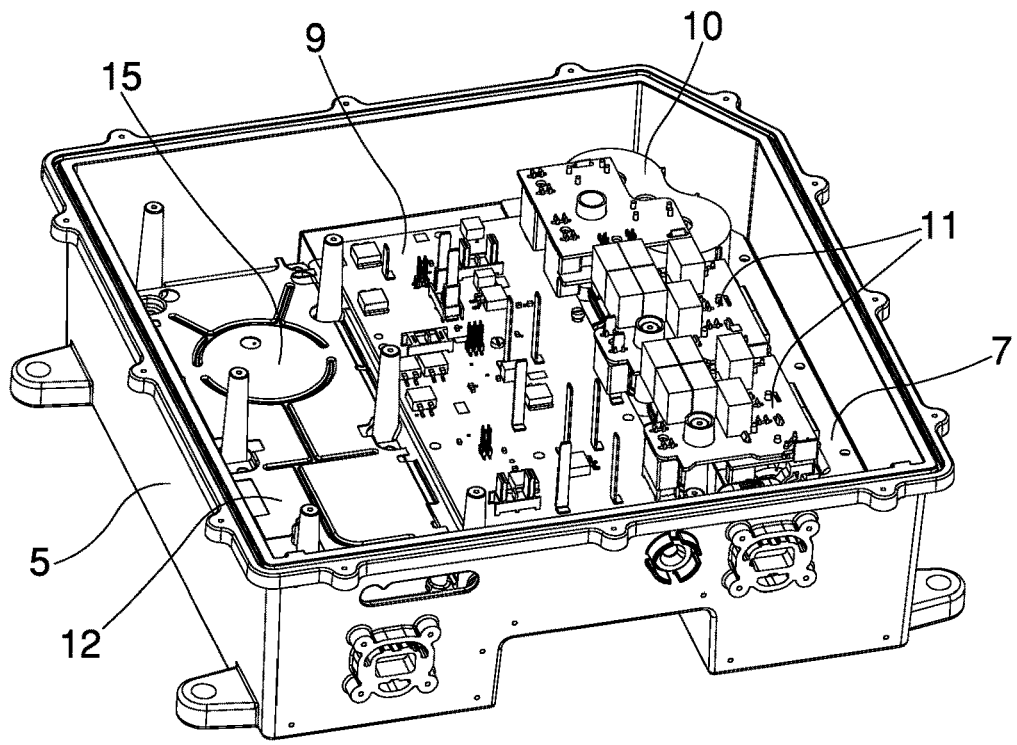
Figure 8:
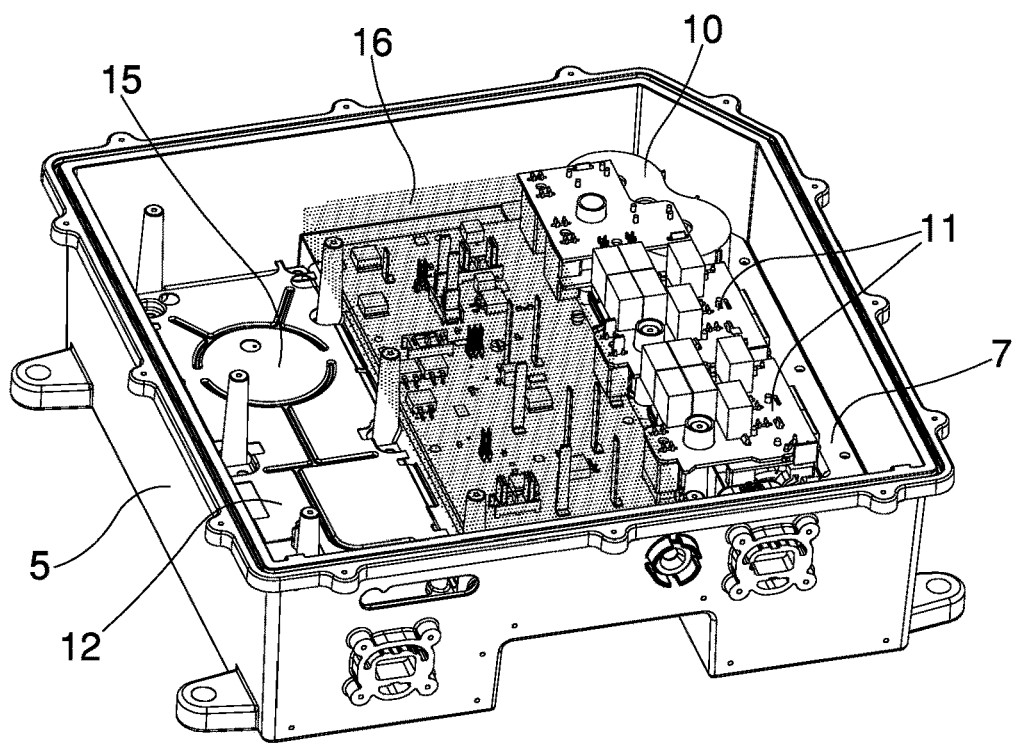
Figure 9:
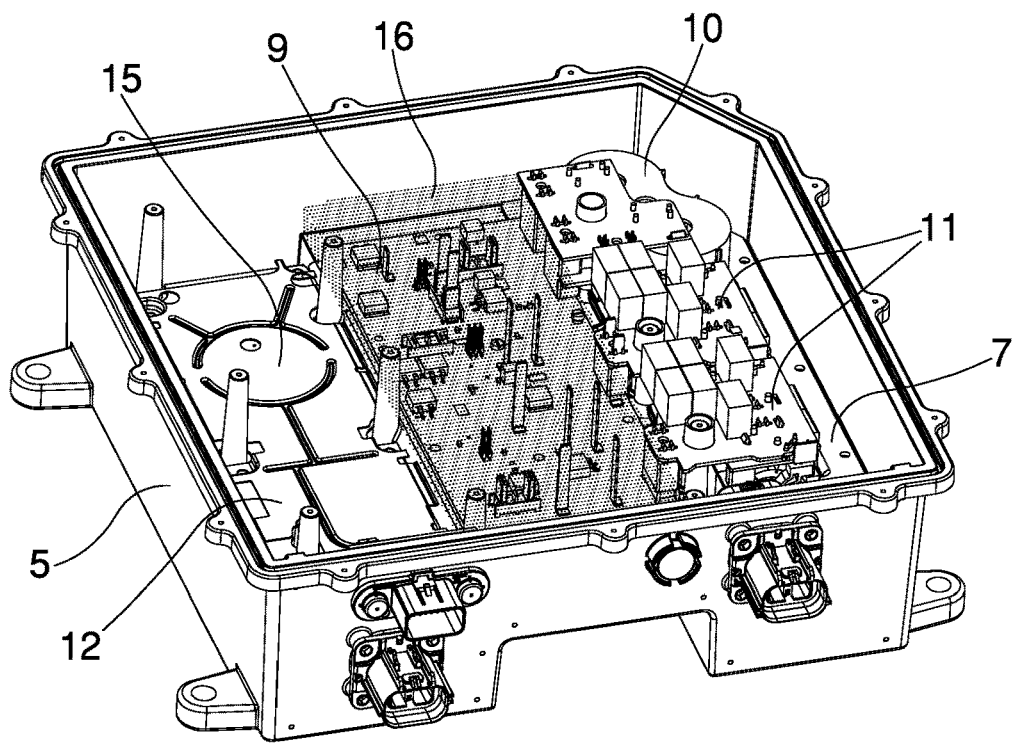
Figure 10:
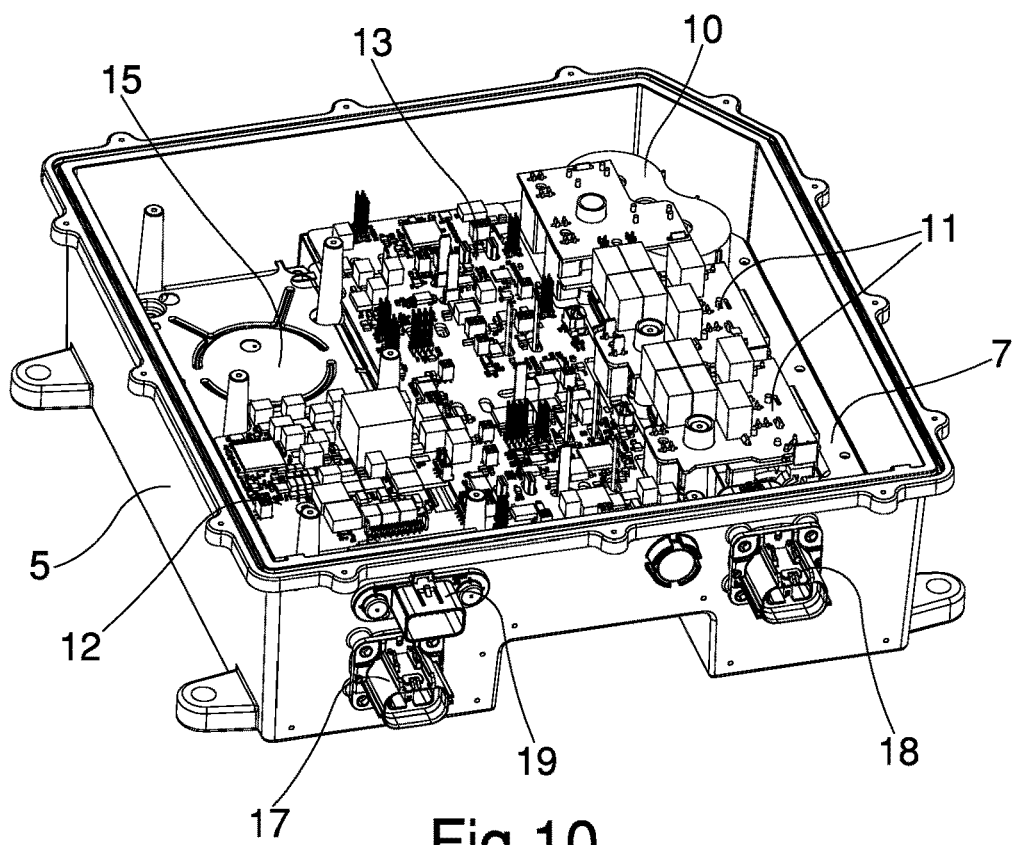

Furthermore, the realization of the cooling circuit 4 comprises:
- making the heat dissipation metal jig 7, provided with at least one housing seat for the electronic power circuit 3;
- associating the metal jig 7 with the inner portion of the housing body 5 (FIG. 4).

In particular, the metal jig 7 can be made through a deep drawing process of at least one metal sheet.

Once the metal jig 7 has been positioned, the cooling circuit 4 is made up of a sequence of inter-spaces defined between the inner portion of the housing body 5 and the metal jig 7.

The process therefore involves the housing of the electronic power circuit 3 inside the housing body 5, together with other electronic control or power supply components (FIGS. 5 to 11).

Figure 11:
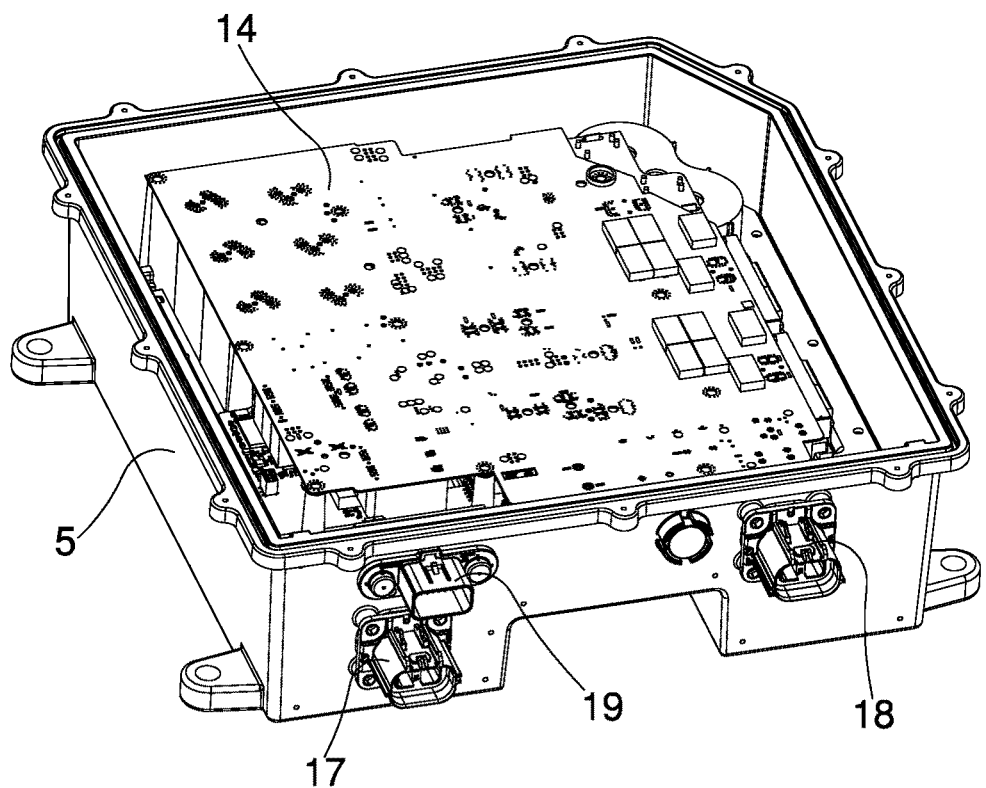

In particular, with reference to the specific embodiment shown in the illustrations, referring to the positioning and fixing of all components inside the housing body 5 of an OBC battery charger, the process involves the following steps:
- position and fix the IMS printed circuit 9 to the metal jig 7 (FIG. 5), with appropriate sealing gasket;
- position at least one plastic support 20 (FIG. 6);
- position and connect a PFC circuit 10 (FIG. 7);
- position and connect an LLC circuit 11 (FIG. 7):
- position and connect an AC filter 12 and a relative electromagnetic shielding 15 (FIG. 7);
- inject an isolating resin 16 onto the IMS printed circuit 9 (FIG. 8);
- position and fix an AC input connector 17, a DC output connector 18 and a command connector 19 (FIG. 9) to the housing body 5;
- position and connect a command printed circuit 13 (FIG. 10);
- position and connect a supply circuit 14 (FIG. 11).

Usefully, the connectors 17, 18 and 19 are made of polymeric material and, alternatively, can be made in a single body piece and integral with the housing body 5 during the molding of the housing body itself.

Figure 12:
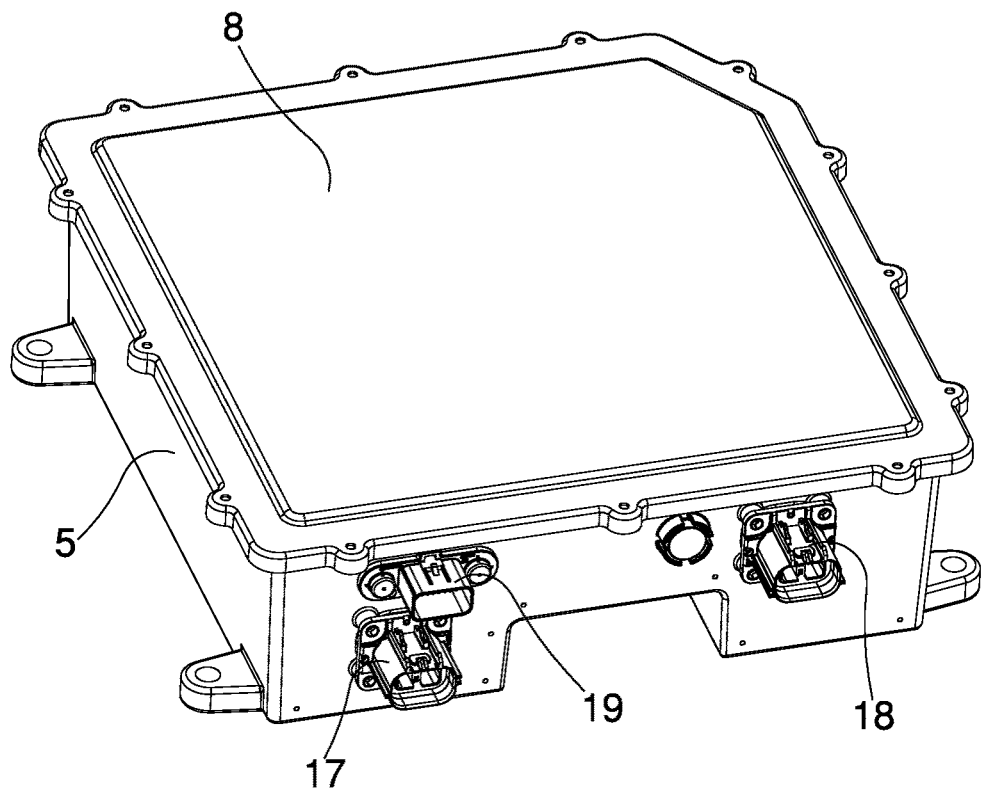

Subsequently, the process comprises the realization of a metal cover 8, preferably of aluminum, and the fixing of the cover 8 to the housing body 5, for closing the housing body itself (FIG. 12).

Furthermore, the process comprises making at least one shielding metal sheet 6. In particular, this at least one shielding metal sheet 6 is preferably made by a cutting and cold forming process.

The process therefore comprises fixing the shielding metal sheet 6 to at least one portion of the outer surface of the housing body 5, for the shield of the electromagnetic waves generated by the electronic power circuit 3.

Figure 13:
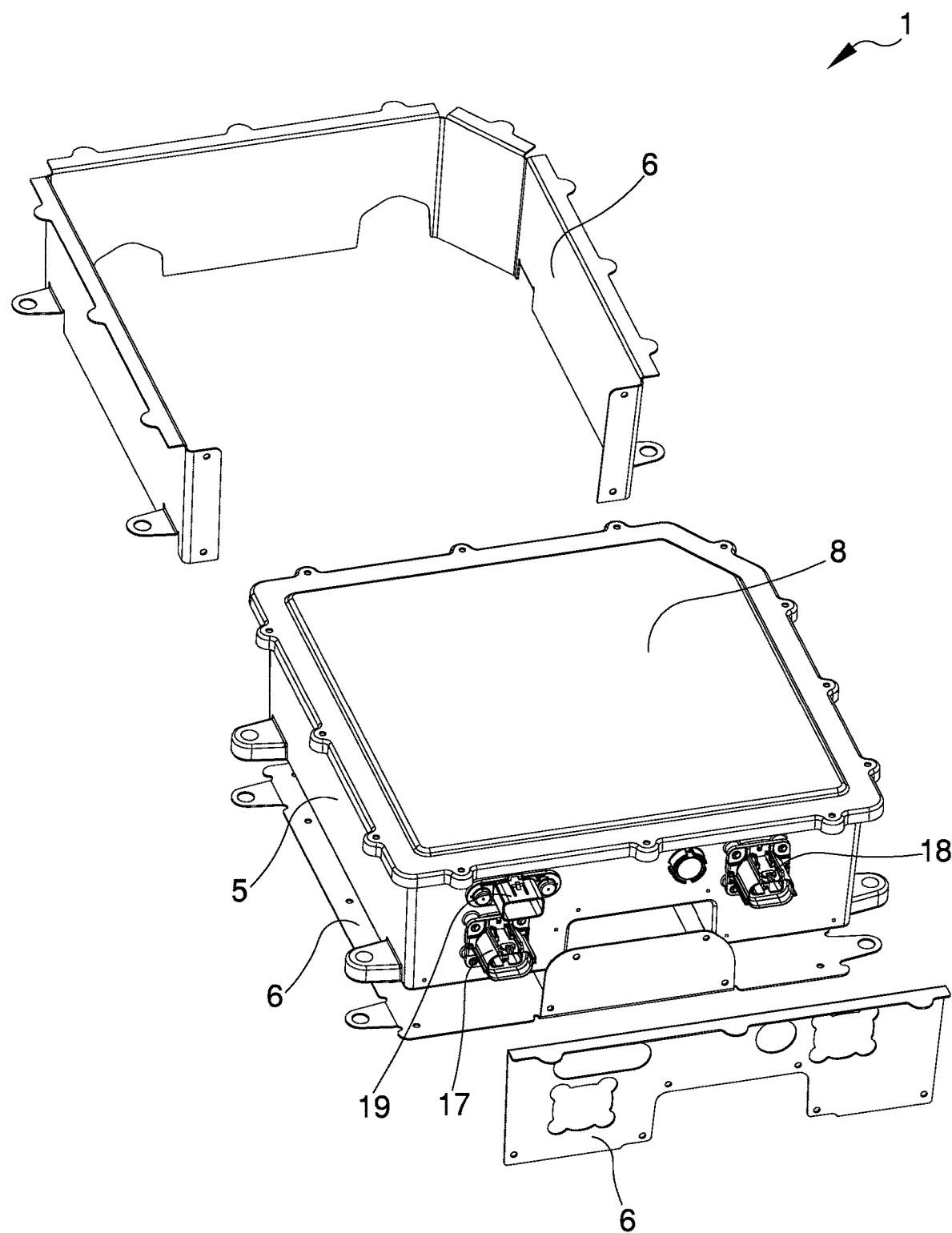

In particular, with reference to a preferred embodiment, shown in the illustrations, the process involves the realization of a plurality of shielding metal sheets 6 fixed on the entire outer surface of the housing body 5 (FIG. 13).

It has in practice been ascertained how the described invention achieves the intended objects.

In particular, the fact is underlined that the electronic power apparatus according to the invention and related realization process make possible a significant reduction in the overall realization costs.

In fact, the realization and use of a housing body made of polymeric material allows avoiding the use of costly and limited life-time dies like those conventionally used for the die-casting of metal containers, thus considerably reducing overall realization costs.

Furthermore, the housing body in polymeric material is easier to produce than solutions of known type, inasmuch as further machining operations after molding are reduced to the fewest possible.

In practice, therefore, the apparatus and the process according to the invention make it possible to eliminate all the processes related to aluminum die-casting, with all the resulting limits (re-machining required after casting, limited life-span of the dies, machining operations at high temperature 900° with considerable environmental impacts).

To this must be added the fact that the use of the housing body made of polymeric material makes possible the realization of a lighter apparatus compared to solutions of known type.

The specific liquid cooling circuit present on the apparatus according to the invention also makes possible the more effective cooling of the electronic power circuit (and of the electronics as a whole) of the apparatus itself.

In this respect, the FIG. 14 shows an illustrative table indicating the temperatures measured by various sensors positioned on the electronic power circuit of the apparatus according to the invention, provided with a plastic container, compared to the temperatures measured on a known type of apparatus, provided with a conventional aluminum container.

In particular, such temperatures are measured considering the following test conditions:
- 220 Vac input voltage;
- 300 Vdc output voltage;
- 6.6 kW power output;
- 25° C. ambient temperature;
- 20° C. coolant temperature;
- 60 minute charging time.

Below is a key of the wordings shown on the table in FIG. 14:
- LLC1: first temperature sensor of the MOSFET LLC bridge on the IMS circuit;
- PFC1: first temperature sensor of the MOSFET PFC on the IMS circuit;
- Trasf1: first temperature sensor on the transformer windings;
- Res1: first temperature sensor on the resonant windings;
- LLC2: second temperature sensor of the MOSFET LLC bridge on the IMS circuit;
- PFC2: second temperature sensor of the MOSFET PFC on the IMS circuit;
- Trasf2: second temperature sensor on the transformer windings;
- Res2: second temperature sensor on the resonant windings.

Furthermore, the realization of the housing body made of polymeric material makes it possible to achieve a more effective electrical insulation compared to solutions of known type.

Finally, the combined use of the housing body made of polymeric material and of the shielding metal sheets arranged on the outer surface of the housing body itself makes it possible to obtain effective shielding from electromagnetic waves.

In this regard, FIG. 15 shows an illustrative graph indicating, by means of a continuous line, the variation in the level of emission of electromagnetic waves of the apparatus according to the invention, provided with a plastic container. Furthermore, by means of a dotted line, the variation is shown in the level of electromagnetic wave emissions of a known apparatus provided with a conventional aluminum container.

In particular, such emission levels are measured considering the following test conditions:
- 220 Vac input voltage;
- 390 Vdc output voltage;
- 6.6 kW power output;
- frequency range from 30 MHz to 1000 MHz.

As can be seen from the graph in FIG. 15, the emission level of the apparatus according to the invention is superimposable and for most of the frequencies even lower, compared to the emission level of an apparatus of known type.

The invention claimed is:

1. An OBC charger for electric or hybrid cars, comprising:
   at least one external container;
   at least one electronic power circuit housed inside said at least one external container and configured for conversion of an input current/voltage into a predefined output current/voltage; and
   at least one liquid cooling circuit made at a portion of said at least one external container for cooling said at least one electronic power circuit;
   wherein said at least one external container comprises a housing body of said at least one electronic power circuit in a polymeric material and comprising at least one portion provided with said at least one liquid cooling circuit,
   wherein said at least one external container comprises at least one shielding metal sheet associated with at least one portion of an outer surface of said housing body for shielding of electromagnetic waves generated by said at least one electronic power circuit,
   wherein said at least one shielding metal sheet comprises multiple shielding metal sheets that extend over an entirety of the outer surface of said housing body,
   wherein said at least one external container comprises at least one metal closure cover of said housing body,
   wherein said at least one external container comprises at least one heat dissipation metal jig provided with at least one housing seat for said at least one electronic power circuit, and
   wherein said at least one liquid cooling circuit comprises at least one inter-space defined between an inner portion of said housing body comprising said polymeric material and said at least one heat dissipation metal jig.

2. The OBC charger according to claim 1, wherein said at least one heat dissipation metal jig is associated with said inner portion of said housing body and at least one length of said at least one liquid cooling circuit.

3. The OBC charger according to claim 1, wherein said at least one heat dissipation metal jig is associated with at least one inner portion of said housing body.

4. A process for making an OBC charger for electric or hybrid cars, the process comprising:
   making at least one housing body in a polymeric material;
   housing at least one electronic power circuit inside said at least one housing body, said at least one electronic power circuit being configured for conversion of an input current/voltage into a predefined output current/voltage,
   making at least one liquid cooling circuit that is disposed at least one inner portion of said at least one housing body;
   making at least one shielding metal sheet; and
   associating said at least one shielding metal sheet with at least one portion of an outer surface of said at least one housing body in said polymeric material, for a shielding of electromagnetic waves generated by said at least one electronic power circuit,
   wherein said at least one shielding metal sheet comprises multiple shielding metal sheets that extend over an entirety of the outer surface of said housing body,
   wherein said at least one housing body comprises at least one metal closure cover of said at least one housing body,
   wherein said at least one housing body comprises at least one heat dissipation metal jig provided with at least one housing seat for said at least one electronic power circuit, and
   wherein said at least one liquid cooling circuit comprises at least one inter-space defined between an inner portion of said housing body comprising said polymeric material and said at least one heat dissipation metal jig.

5. The process according to claim 4, wherein said step of making said at least one housing body comprises an operation of injection molding of said polymeric material.

6. The process according to claim 4, wherein said step of making said at least one heat dissipation metal jig comprises a deep drawing process of at least one metal sheet.

7. The process according to claim 4, wherein said step of making said at least one shielding metal sheet comprises a cutting and cold forming process.

\* \* \* \* \*